(12) United States Patent
Hoeglauer et al.

(10) Patent No.: US 7,632,759 B2
(45) Date of Patent: Dec. 15, 2009

(54) SEMICONDUCTOR DEVICE WITH FRONT SIDE METALLIZATION AND METHOD FOR THE PRODUCTION THEREOF

(75) Inventors: Josef Hoeglauer, Munich (DE); Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 310 days.

(21) Appl. No.: 11/532,270

(22) Filed: Sep. 15, 2006

(65) Prior Publication Data
US 2007/0080391 A1    Apr. 12, 2007

(30) Foreign Application Priority Data
Sep. 16, 2005    (DE) .................. 10 2005 044 510

(51) Int. Cl.
| | |
|---|---|
| H01L 23/48 | (2006.01) |
| H01L 23/52 | (2006.01) |
| H01L 29/40 | (2006.01) |
| H01L 21/31 | (2006.01) |
| H01L 21/469 | (2006.01) |

(52) U.S. Cl. .................. 438/758; 257/781; 257/780; 257/784

(58) Field of Classification Search ............ 438/758; 257/779, 780, 781, 625, 624, 778, 738, 777
See application file for complete search history.

(56) References Cited

U.S. PATENT DOCUMENTS

| | | | | |
|---|---|---|---|---|
| 4,132,813 A | | 1/1979 | Schaal | 427/90 |
| 6,013,572 A | * | 1/2000 | Hur et al. | 438/614 |
| 6,107,687 A | * | 8/2000 | Fukada et al. | 257/762 |
| 6,316,830 B1 | * | 11/2001 | Lin | 257/737 |
| 6,340,616 B1 | | 1/2002 | Mosig et al. | 438/268 |
| 6,515,373 B2 | * | 2/2003 | Barth | 257/781 |
| 6,583,516 B2 | * | 6/2003 | Hashimoto | 257/781 |
| 6,815,327 B2 | * | 11/2004 | Farnworth | 438/614 |
| 2001/0028083 A1 | * | 10/2001 | Onishi et al. | 257/328 |
| 2003/0015134 A1 | * | 1/2003 | Tungare et al. | 117/86 |
| 2003/0042614 A1 | * | 3/2003 | Deraa et al. | 257/768 |
| 2008/0001288 A1 | * | 1/2008 | Sogawa et al. | 257/737 |

FOREIGN PATENT DOCUMENTS

EP    0720234 B1    3/2006

OTHER PUBLICATIONS

Huang et al., Thin Cracking and Ratcheting Caused by Terperature Cycling, J. Mater. Res., vol. 15, No. 6, pp. 1239-1242, 2000.

* cited by examiner

*Primary Examiner*—Chuong A. Luu
(74) *Attorney, Agent, or Firm*—Banner & Witcoff, Ltd.

(57) ABSTRACT

A semiconductor device (2) has a semiconductor chip (16) the front side (1) of which has integrated circuit elements and an electrically conductive metallization structure (3) with chip contact areas (9). The metallization structure (3) has an electrically conductive patterned adhesion layer (6), which provides a low-resistance contact with silicon, and an electrically conductive patterned intermediate layer (7), which provides a connectable surface. Furthermore, a passivation layer (8) is provided, which covers the top side and the edge sides of the intermediate layer (7) whilst leaving the chip contact area (9) free. The intermediate layer (7) comprises Ni and is free of noble metals. The intermediate layer (7) is at least 10 times thicker than the adhesion layer (6).

25 Claims, 2 Drawing Sheets

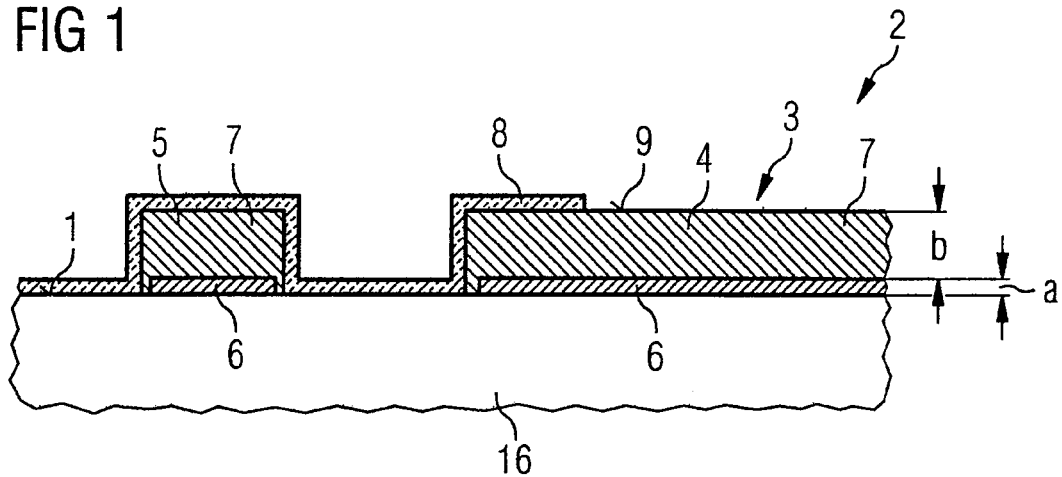
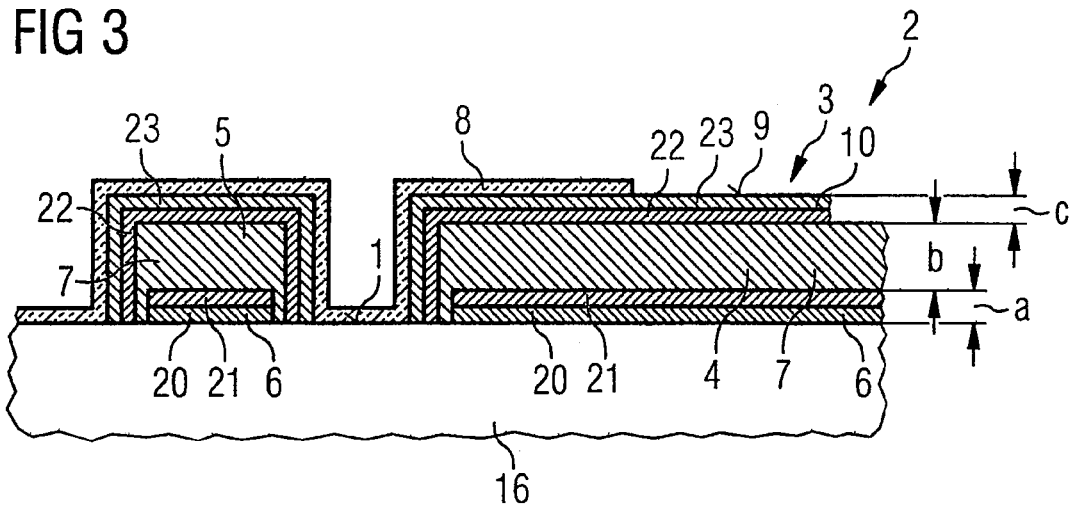

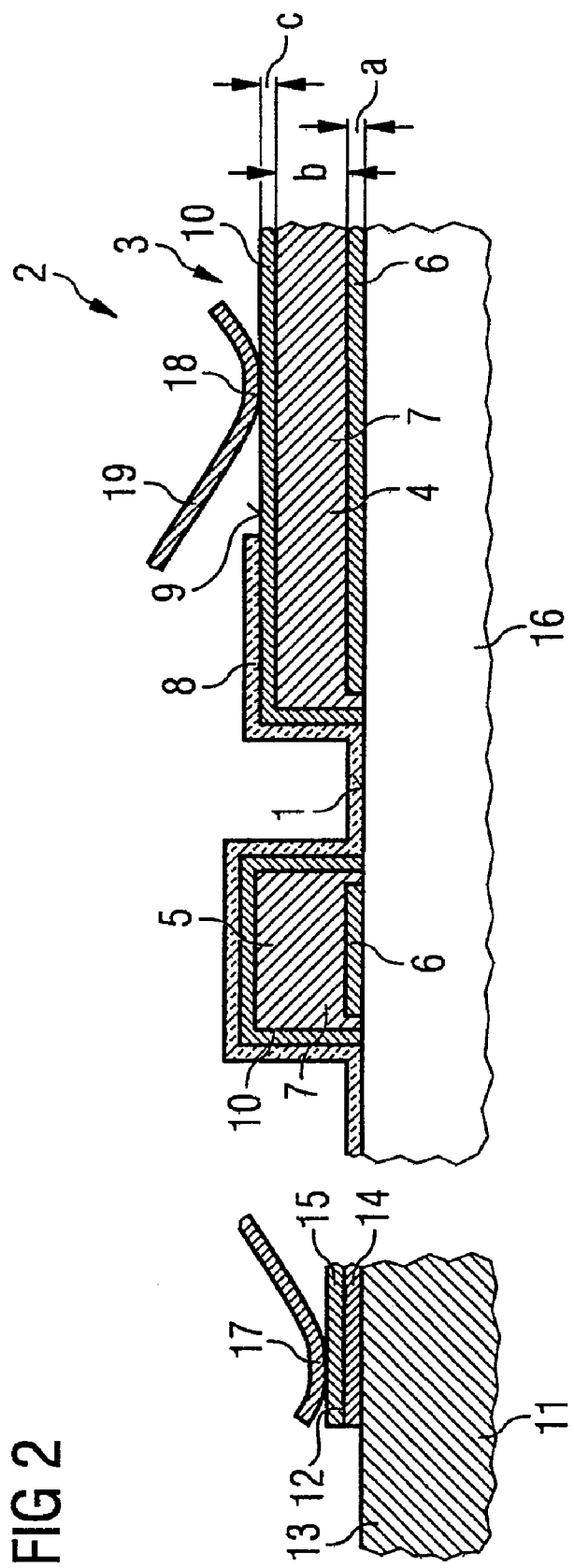

SEMICONDUCTOR DEVICE WITH FRONT SIDE METALLIZATION AND METHOD FOR THE PRODUCTION THEREOF

PRIORITY

This application claims priority from German Patent Application No. DE 10 2005 044 510.1, which was filed on Sep. 16, 2005, and is incorporated herein by reference in its entirety.

TECHNICAL FIELD

The invention relates to semiconductor devices with front side metallization and methods for the production thereof.

BACKGROUND

The front side metallization of semiconductor devices has the task of specifying a reliable low-resistance contact with the integrated circuit elements of the semiconductor chips. The reliability and usability of present-day front side metallizations are limited, however.

Thermal loading on packaged semiconductor chips may cause cracking at the boundaries between the different materials of the device. Said cracking is caused by the difference between the coefficients of thermal expansion of the materials used and may lead to the failure of the device. The cracking may occur at the boundary between the semiconductor chip and the plastic housing composition and also between the metallic circuit carrier and the plastic housing composition.

It is generally known that cracks can occur between the metallization and the dielectric passivation on the semiconductor chip. Cracks can also form in the passivation layer and grow and propagate from the passivation layer into the semiconductor chip. This problem is described for example in "Thin film cracking and ratcheting caused by temperature cycling", M. Huang and Z. Suo, J. Mater. Res. Vol. 15, No. 6, June 2000.

It is also known from this document that cracking at the boundaries between the metallization and the passivation layer on a semiconductor chip constitutes an increasing problem in the case of continuous temperature cycling.

In addition to improved temperature stability there is also the need for a metallization which can be connected more simply and more reliably to the contact elements, e.g. bonding wires, of the device and also to the contact areas of an external printed circuit board.

U.S. Pat. No. 4,132,813 discloses applying an Ni layer on an Al—Ni front side metallization. An Ni layer has the advantage that it can be wetted by soft solder. The temperature stability of this metallization is inadequate, however, as mentioned above, since the thick Al metallization layer leads to cracking in the passivation layer.

SUMMARY

A semiconductor device may comprise a semiconductor chip having a front side and a rear side. The front side of the semiconductor chip has integrated circuit elements and an electrically conductive metallization structure with chip contact areas. The metallization structure has the following layers: an adhesion layer, an intermediate layer and a passivation layer. An electrically conductive patterned adhesion layer is specified, which is arranged on the surface of the front side of the semiconductor chip and provides a low-resistance contact with silicon. An electrically conductive patterned intermediate layer is arranged on the adhesion layer and provides a connectable surface. The passivation layer covers the top side and the edge sides of the intermediate layer whilst leaving the chip contact area free. According to the invention, the intermediate layer comprises Ni and is free of noble metals. The intermediate layer is at least 10 times thicker than the adhesion layer. Such a front side metallization of a semiconductor chip may better withstand thermal loading and may also be used simply and reliably in semiconductor devices.

BRIEF DESCRIPTION OF THE DRAWINGS

The invention is explained in more detail in the drawings on the basis of the figures.

FIG. 1 shows a front side metallization according to a first embodiment,

FIG. 2 shows a detail from a semiconductor device with a flat conductor leadframe and a front side metallization according to a second embodiment, and FIG. 3 shows a front side metallization according to a third embodiment.

DETAILED DESCRIPTION

The front side metallization is intended to have a good electrical conductivity and to enable a low-resistance contact with the material of the semiconductor chip, typically silicon. Furthermore, the front side metallization is intended to have a connectable surface at least in the regions of the chip contact area, with the result that it is possible to produce a low-resistance contact with contact elements such as bonding wires.

The front side metallization according to an embodiment may have the advantage that the different functions of the front side metallization are provided by different layers. Consequently, the properties can be optimized separately by the selection of each layer.

The material of the adhesion layer is selected such that a low-resistance contact with the semiconductor chip is provided. Since the adhesion layer is thinner than the intermediate layer, the temperature stability of the adhesion layer is of little importance. The intermediate layer is thicker and has the function of carrying the current. Therefore, the material of the intermediate layer is selected such that the current-carrying capacity and the temperature stability are improved. In the case of the arrangement according to an embodiment it is not necessary for the material of the intermediate layer to enable a low-resistance contact with the semiconductor chip. This function is provided by the adhesion layer. The number of suitable materials for the intermediate layer is therefore extended.

In contrast to the known front side metallizations, the electrically conductive structure primarily has nickel in one exemplary embodiment. The use of nickel as intermediate layer results in an improvement in the temperature stability. Nickel is harder than Al and Cu, which form the known structures, and has a better temperature stability since Ni does not exhibit a transition to a liquid-like state under continuous temperature loading. The intermediate layer is at least 10 times thicker than the adhesion layer. Consequently, the temperature stability of the front side metallization is dominated by the properties of the nickel layer. Nickel does not provide a low-resistance contact with silicon, but this disadvantage is overcome by the adhesion layer.

The passivation layer may have SiN and is arranged on the top side and also at the edge sides of the intermediate layer and essentially completely covers the latter. Cracking between the intermediate layer and the passivation layer is consequently avoided. This arrangement has the further advantage that a boundary between the adhesion layer and the passivation layer can be avoided. The material of the adhesion layer can thus be selected without having to take account of the properties of a boundary between the material of the adhesion layer and the material of the passivation layer.

In a further embodiment, the intermediate layer also comprises Cu besides Ni, the Cu portion being significantly greater than the Ni portion. The intermediate layer of the front side metallization may have the same material everywhere or the intermediate layer may have regions of different materials. In one embodiment, the intermediate layer has Ni and Cu, the intermediate layer being subdivided into Ni regions and Cu regions. This embodiment has the advantage that the material of the intermediate layer can be selected for a specific application. A metal may thus form the intermediate layer of the power connection, while a different material forms the intermediate layer of the control connection. The properties of the front side metallization can thus be optimized further.

In a further embodiment, the intermediate layer is at least 100 times thicker than the adhesion layer. This arrangement has the advantage that the properties of the front side metallization are further dominated by the intermediate layer, with the result that the risk of cracking is reduced further.

The adhesion layer may have a thickness of between 1 nm and 1 μm and the intermediate layer may have a thickness of between 100 nm and 100 μm. The intermediate layer is thus at least 10 times thicker than the adhesion layer. This order of magnitude also has the advantage that the material consumption is not unnecessarily high. The material costs and also the deposition time and production costs are thus reduced.

In a further embodiment, a refinement layer is additionally arranged on the intermediate layer. The refinement layer may provide improved protection against corrosion. Furthermore, the refinement layer may also provide a better or a desired connectable surface. According to an embodiment, the properties of the refinement layer can be determined and selected separately.

By way of example, the refinement layer may have a material which is suitable for bonding wire connections and/or can be wetted by soft solder. The material of the refinement layer can thus be selected such that it enables the desired type of connection. In this embodiment, the refinement layer essentially completely covers the top side and also the edge sides of the intermediate layer. Consequently, the passivation layer is arranged on the refinement layer and is not in direct contact with the intermediate layer.

In a further embodiment, the refinement layer consists essentially of NiP. The P content may be approximately 2%. NiP has the advantage that it is suitable for Al and Cu bonding wire connections and also Cu clip contact connections. Cu clips are normally electrically connected to the contact areas by means of an Sn-based solder. In contrast thereto, Al and Cu bonding wires are electrically connected to the contact areas by means of thermocompression or ultrasonic bonding. The bonding wire connections are produced by producing intermetallic phases at the boundary between the material of the bonding wire and the material of the contact area.

This embodiment may advantageously be used in the case of devices which have Cu and also Al bonding wire connections. The production method is simplified since a single front side metallization can be deposited for all of the contact areas. Additional steps used to produce two different contact area groups from two different materials are thus avoided.

A front side metallization according to an embodiment with an NiP refinement layer has the further advantage that it can be used in a simple manner in known mounting methods. NiP is also a hard material and does not form a transition to a liquid-like state under continuous temperature cycling. The advantages of an Ni-based front side metallization are thus furthermore present.

In an alternative embodiment, the refinement layer has at least two layers, in which case the bottommost layer may comprise Ti and the topmost layer may comprise Ag. This arrangement has the advantage that it is suitable for gold bonding wires. The titanium layer has the function of a diffusion barrier layer, with the result that a reaction between the nickel of the intermediate layer and the silver of the refinement layer is avoided and a stable Ag layer is provided.

The titanium layer may have a thickness of between 1 nm and 1000 nm and the Ag layer may have a thickness of between 100 nm and 10 μm.

In a further embodiment, the refinement layer has regions which have different materials. The power connection may thus comprise a refinement metal, while the control connection comprises a different metal. This embodiment has the advantage that the refinement can be adapted to the material of the different contact elements used. This is advantageous in the case of devices in which the power contact element and the control element have different materials.

In one embodiment, the adhesion layer has Al and may comprise AlSi, AlSiCu or AlCu or consist essentially one of said materials. Al and Al-based alloys have the advantage that they provide a low-resistance contact with silicon and consequently with the semiconductor chip and are cost-effective. They also have a good electrical conductivity. According to an embodiment, the thickness of the adhesion layer is at least 10 times less than the thickness of the intermediate layer. As a result, the problem of cracking in the passivation layer is avoided since the mechanical loading on the passivation layer which is caused by the liquid-like qualities of Al is avoided.

In an alternative embodiment, the adhesion layer has titanium. A deposited titanium layer forms a TiSi layer with the silicon of the semiconductor chip, which provides a low-resistance contact. The TiSi contact may advantageously be produced by means of the available TiSi barrier process since this method and consequently the contacts produced thereby are reliable.

In this process, after an HF cleaning, a Ti layer, for example with the thickness of approximately 45 nm, is deposited by means of sputtering. The deposited Ti layer is annealed in an RTP furnace (in a so-called Rapid Thermal Processing furnace) for 20 s at 700° C. in an $N_2$ atmosphere. The TiN layer formed is then etched wet-chemically in order to give rise to a low-resistance contact with a pure surface.

The adhesion layer may also have two layers. In one embodiment, the adhesion layer is a $TiSi_2$ layer arranged on the front side of the semiconductor device and has a TiN or TiON layer arranged on the $TiSi_2$ layer.

In an alternative embodiment, the adhesion layer has a layer made of Al or Cr arranged on the front side of the semiconductor chip, and a titanium layer arranged on the Al or Cr layer.

The metals Ti, Cr or Al deposited on the front side are deposited with a layer thickness of between 1 nm and 1 μm. An adhesion layer comprises two layers has the advantage that titanium forms a diffusion barrier layer. This leads to a more reliable front side metallization since the temperature stability is improved further.

The semiconductor device with a front side metallization according to one of the previous embodiments may be a power semiconductor device. The front side metallization according to an embodiment may advantageously be used in the case of power semiconductor devices since the losses in the front side metallization only make up a small proportion of the total losses. Therefore, the lower conductivity of Ni in comparison with Al and Cu has little influence on the total losses of the device. The power semiconductor device may be a MOSFET, IGBT or a diode and, in a further embodiment, may be a vertical power semiconductor device.

A semiconductor device according to one of the previous embodiments may furthermore comprise a circuit carrier having internal contact areas and external contact areas. The circuit carrier may be a flat conductor leadframe having a chip island and a plurality of flat conductors.

The chip contact areas of the semiconductor chip are electrically connected to the internal contact areas of the circuit carrier via Al bonding wires and/or Cu bonding wires and/or a Cu clip. In an advantageous manner, the control connection, for example the gate contact, is electrically connected to the flat conductor leadframe via gold wires and the load connection, for example the source contact of the semiconductor chip, is electrically connected to said flat conductor leadframe via Al bonding wires. Gold bonding wires have the advantage of a very good conductivity. Al bonding wires are advantageous for the power supply since their wire diameter is much larger and the costs can be reduced by using Al wire instead of Au wire.

In one embodiment, the internal contact areas of the circuit carrier and the surface of the front side metallization substantially comprise the same material. This has the advantage that the bonding method is simplified since the bonding conditions for the two ends of each connection are substantially identical. Consequently, the conditions, such as, for example, temperature, time, pressure, can be optimized just once. The bonding connection step can also be carried out more rapidly since the same bonding conditions can be used for each contact location.

The invention also relates to the production of front side metallizations and provides a method for the production thereof. The first step involves providing a semiconductor chip having a front side and a rear side. The front side has integrated circuit elements. An electrically conductive patterned adhesion layer is applied to the front side of the semiconductor chip. The adhesion layer provides a low-resistance contact with silicon. An electrically conductive patterned intermediate layer is then applied to the patterned adhesion layer, the intermediate layer providing a connectable surface. A passivation layer is subsequently applied. The passivation layer covers the top side and also the edge sides of the intermediate layer whilst leaving the chip contact area free. According to an embodiment, the intermediate layer has nickel and is free of noble metals. The intermediate layer is applied with a thickness that is at least 10 times thicker than the adhesion layer.

This method is typically produced on the top side of the semiconductor chip, while the semiconductor chip is in the form of a wafer. The wafer has a plurality of semiconductor chips arranged in rows and columns. In this way, the front side metallization is produced simultaneously on a plurality of semiconductor chips and the production costs are thereby reduced.

This method has the advantage that known deposition methods can be used to produce the front side metallization according to an embodiment. The adhesion layer, the intermediate layer and the passivation layer may be deposited by means of sputtering or CVD or PVD or electrodeposition.

The different layers may be applied by means of the same method or by different methods. It is advantageous to use the same method since the front side metallization can be applied in a deposition chamber without the vacuum having to be interrupted.

In a further embodiment, the intermediate layer is applied with a thickness which is at least 100 times thicker than the adhesion layer. The adhesion layer may have at least two layers which are deposited successively. In a further embodiment, a refinement layer is deposited on the intermediate layer. The adhesion layer is deposited with a thickness of between 1 nm and 1 µm. The intermediate layer is deposited with a thickness of between 100 nm and 100 µm.

The invention also provides a method for producing a semiconductor device. A semiconductor device according to one of the embodiments described above is provided. A leadframe having internal contact areas and external contact areas is also provided. The external contact areas enable an electrical connection between the device and a superordinate printed circuit board. Electrical connections are produced between the chip contact areas and the internal contact areas of the circuit carrier.

In one embodiment, the electrical connections are produced between the chip contact areas and the internal contact areas by means of bonding wires. The bonding wires may be electrically and mechanically connected to the chip contact areas and also the internal contact areas of the leadframe by means of known methods such as thermocompression bonding and ultrasonic bonding. The connection is produced by producing intermetallic phases at the boundary between the material of the bonding wire and the material of the contact area.

As an alternative, the electrical connection between the chip contact areas and the internal contact areas may be produced by means of a metallic clip. This is advantageous if the device is a vertical power device which is mounted with the drain contact towards the top. In this embodiment, the contact is electrically and mechanically connected to the contact area on the semiconductor chip and also to the circuit carrier by means of soft solder or diffusion solder.

The semiconductor chip, the internal contact areas and the connections between the semiconductor chip and the internal contact areas may subsequently be embodied in a plastics composition that forms the housing of the device.

FIG. 1 shows a detail from the top side 1 of a semiconductor device 2 with a front side metallization 3 according to a first embodiment. In FIGS. 1 to 3, the front side metallization 3 is not illustrated true to scale, and in particular the thickness of the various layers is enlarged, in order to better elucidate the invention.

The top side 1 of the semiconductor chip 16 has integrated circuit elements that are not shown in the figure. In this embodiment, the semiconductor device 2 is a vertical MOSFET and the top side 1 of the semiconductor chip 16 has a source contact 4 and a gate contact 5, which are constructed from the front side metallization 3.

According to the first embodiment, the front side metallization 3 comprises three layers 6, 7 and 8. An electrically conductive patterned adhesion layer 6 is arranged on the top side 1 of the device 2, which layer provides a low-resistance electrical contact with the silicon of the semiconductor chip 16. The adhesion layer 6 is patterned in order to define the gate contact 5 and the source contact 4 and in order to specify a low-resistance contact between the metallization 3 and the integrated circuit elements.

In the first embodiment, the adhesion layer 6 has Al-1% Si. The adhesion layer 6 was deposited with a thickness a of 50 nm on the top side of the semiconductor chip 16 and then patterned by means of photoresist techniques.

An intermediate layer 7 made of Ni is arranged on the adhesion layer 6 and is patterned in such a way that the intermediate layer 7 covers the top side and also the edge sides of the adhesion layer 6. The patterning of the intermediate layer 7 thus corresponds to the pattern of the patterned adhesion layer 6. The intermediate layer 7 has a thickness b of 5 μm and is significantly thicker than the adhesion layer 6 having a thickness of 10 nm. The properties of the metallization 3 are thus dominated by the properties of the intermediate layer 7.

A passivation layer 8 is arranged on the top side and at the edge sides of the intermediate layer 5. The contact areas 9 of the front side metallization 3 remain free of the passivation layer 8 in order that a good electrical connection to a bonding wire or a clip can be produced. The passivation layer has SiN.

The front side metallization according to FIG. 1 has the advantage that the Al adhesion layer is covered with a thick Ni layer. On account of the thickness ratio between the adhesion layer and the intermediate layer, the front side metallization primarily has Ni.

In a further embodiment (not shown), the front side metallization also comprises Cu besides Ni, the Cu portion being significantly greater than the Ni portion. In this embodiment, the intermediate layer of the front side metallization has regions which substantially comprise Ni and regions which substantially comprise Cu.

The problem of cracking between the SiN passivation layer 8 and the underlying metallization 6, 7 is avoided since the intermediate layer 7 is arranged between the Al layer 6 and the SiN layer 8. Ni is harder than Al and also has an improved temperature stability since Ni does not exhibit a transition to a liquid-like state under continuous temperature loading. The arrangement according to an embodiment of a thick Ni intermediate layer reduces the mechanical loading between the metallization 3 and the SiN passivation 8 and the risk of cracking in the passivation layer and also in the silicon of the semiconductor chip 16.

FIG. 2 shows a semiconductor device 2 with a front side metallization 3 according to a second embodiment. Components having the same functions as in FIG. 1 are identified by identical reference symbols in FIGS. 1 to 3 and are not discussed separately.

The second embodiment of the front side metallization 3 differs by virtue of an additional refinement layer 10, which is applied on the top side and also at the edge sides of the intermediate layer 7. In this embodiment, the refinement layer 10 consists essentially of Ni-2% P and has a thickness c of approximately 0.5 μm. The refinement layer 10 thus forms the surface of the electrically conductive part of the metallization and constitutes the connectable surface.

The refinement layer 10 is arranged between the Ni intermediate layer 7 and the passivation layer 8. The NiP refinement layer has the advantage that it protects the lower Ni intermediate layer against corrosion and provides an improved connectable surface. In particular, it is possible to produce a reliable electrical connection to Al bonding wires and Cu bonding wires and also to a Cu clip. This metallization 3 may advantageously be used in power semiconductor devices since the NiP surface is suitable for the power supply, which typically has thick aluminium alloys or Cu clips, and also for the control, which typically has thin Al wires or copper wires.

FIG. 2 also shows a detail from the metallic flat conductor leadframe 11, which together with the semiconductor chip 16 and also with the bonding wires (not shown here) and with a plastic housing forms the complete semiconductor device 2. This part of the flat conductor leadframe 11 constitutes the internal contact area 12 of the source connection 13. The internal contact area 12 has two layers 14, 15. The bottommost layer 14 comprises Ni and is arranged on the flat conductor leadframe 11. A second NiP layer 15 is arranged on the Ni layer 14 and provides the contact surface.

The internal contact area 12 of the flat conductor leadframe 11 of the semiconductor device 1 has the same materials of the source connection 4 and of the gate connection 5 of the semiconductor chip 16. This arrangement simplifies the bonding connection method since the connection conditions can be optimized for a material combination. The same conditions can also be used for each connection in the device and the production method can be carried out more rapidly.

The two contact locations 17, 18 of a bonding wire connection 19 are also shown in FIG. 2. In this embodiment, the bonding wire 19 comprises aluminium having a diameter of 350 μm. The bonding wire 19 reaches from the surface 9 of the source connection 4 as far as the contact area 12 of the source connection 13 of the flat conductor leadframe 11.

FIG. 3 illustrates a third embodiment of the front side metallization 3. In the third embodiment, the adhesion layer 6 and also the refinement layer 10 have two layers in each case.

The adhesion layer 6 has a first layer 20 made of $TiSi_2$, which is arranged on the top side of the silicon of the semiconductor chip 16, and a second layer made of TiN 21, which is arranged on the $TiSi_2$ layer 20. The two layers 20 and 21 specify a low-resistance contact with the silicon which has a pure surface on which further metallic layers can be reliably applied.

This arrangement can be produced by means of the following methods. After an HF cleaning, a Ti layer is deposited with a thickness of approximately 45 nm by means of sputtering. A $TiSi_2$ layer is formed during this step. The Ti or $TiSi_2$ layer is then heated in an RTP furnace for 20 s at 700° C. in an $N_2$ atmosphere and exclusively subjected to wet-chemical etching in order that a pure surface is produced.

Further two- or multilayer adhesion layers 6 are also possible, for example CrSi, AlSi, CrSi—Ti, AlSi—Ti. These adhesion layers 6 can be used in a front side metallization 3 without an additional refinement layer 10 or with a refinement layer 10 on the Ni intermediate layer 7. The refinement layer 10 may comprise a layer made of NiP.

The electrical conductivity of Ni is 430 μohm*nm. This is not as good as the conductivity of Al (28.7 μohm*nm) and Cu (17.5 μohm*nm). The abovementioned front side metallizations 3 are suitable for high-voltage components having uds of more than 500 V. In high-voltage components, the electrical losses in the front side metallization 3 make up only a small proportion of the total losses. In the case of these devices, it is thus possible to replace a metallization made of aluminium or copper with Ni without the losses significantly increasing.

In the case of low-voltage components, the losses in the front side metallization are appreciable and increase significantly in the case of a material change from Al or Cu to Ni. In the case of low-voltage components it is advantageous to construct the intermediate layer (7) from Ni and Cu.

In the third embodiment of FIG. 3, the refinement layer 10 has two layers 22, 23. The first layer 22 is arranged on the Ni intermediate layer 7 and has Ti. The Ti layer 22 is deposited with a thickness of approximately 10 nm and has the function of a diffusion barrier layer. The second layer 23 comprises Ag and a thickness of 2 μm. The refinement layer 10 of FIG. 3 is suitable for Au bonding wires. In a further embodiment (not shown), the control surface is refined with Ag and the power surface is refined with NiP.

LIST OF REFERENCE SYMBOLS

1 Top side
2 Semiconductor device
3 Front side metallization
4 Source contact
5 Gate contact
6 Adhesion layer
7 Intermediate layer
8 Passivation layer
9 Chip contact area
10 Refinement layer
11 Flat conductor leadframe
12 Internal contact area
13 Source connection
14 First layer of the internal contact area
15 Second layer of the internal contact area
16 Semiconductor chip
17 Contact location
18 Contact location
19 Bonding wire connection
20 First layer of the adhesion layer
21 Second layer of the adhesion layer
22 First layer of the refinement layer
23 Second layer of the refinement layer

What is claimed is:

1. A semiconductor device comprising a semiconductor chip having a front side and a rear side, the front side having integrated circuit elements and an electrically conductive metallization structure with chip contact areas, the metallization structure having the following layers:
   an electrically conductive patterned adhesion layer, the adhesion layer being arranged on the surface of the front side of the semiconductor chip and providing a low-resistance contact with silicon,
   an electrically conductive patterned intermediate layer, which is arranged on the adhesion layer and provides a connectable surface,
   a passivation layer, which covers the top side and the edge sides of the intermediate layer whilst leaving the chip contact area free,
   wherein the intermediate layer comprises Ni and is free of noble metals, and wherein the intermediate layer is at least 10 times thicker than the adhesion layer.

2. The semiconductor device according to claim 1, wherein the intermediate layer also comprises Cu besides Ni, the Cu portion being significantly greater than the Ni portion.

3. The semiconductor device according to claim 1, wherein the intermediate layer also comprises Cu besides Ni, the intermediate layer being subdivided into Ni regions and Cu regions.

4. The semiconductor device according to claim 1, wherein the intermediate layer is at least 100 times thicker than the adhesion layer.

5. The semiconductor device according to claim 1, wherein the adhesion layer has a thickness of between 1 nm and 1 µm.

6. The semiconductor device according to claim 1, wherein the intermediate layer has a thickness of between 100 nm and 100 µm.

7. The semiconductor device according to claim 1, wherein a refinement layer is arranged on the intermediate layer.

8. The semiconductor device according to claim 7, wherein the refinement layer consists essentially of NiP.

9. The semiconductor device according to claim 7, wherein the refinement layer comprises at least two layers, and the bottommost layer comprises Ti and the topmost layer comprises Ag.

10. The semiconductor device according to claim 7, wherein the refinement layer has regions which comprise different materials.

11. The semiconductor device according to claim 1, wherein the adhesion layer comprises Al.

12. The semiconductor device according to claim 11, wherein the adhesion layer comprises AlSi, AlSiCu or AlCu.

13. The semiconductor device according to claim 1, wherein the adhesion layer comprises titanium.

14. The semiconductor device according to claim 1, wherein the adhesion layer comprises at least two layers.

15. The semiconductor device according to claim 14, wherein the adhesion layer is a $TiSi_2$ layer arranged on the front side of the semiconductor device and comprises a TiN or TiON layer arranged on the $TiSi_2$ layer.

16. The semiconductor device according to claim 14, wherein the adhesion layer has a layer made of Al or Cr arranged on the front side of the semiconductor chip, and a titanium layer arranged on the Al or Cr layer.

17. The semiconductor device according to claim 1, wherein the passivation layer comprises SiN.

18. The semiconductor device according to claim 1, wherein the semiconductor device is a power semiconductor device.

19. The semiconductor device according to claim 18, wherein the power semiconductor device is selected from the group consisting of MOSFET, IGBT and diode.

20. The semiconductor device according to claim 19, wherein the power semiconductor device is a vertical power semiconductor device.

21. The semiconductor device according to claim 1, furthermore comprising a circuit carrier having internal contact areas and external contact areas.

22. The semiconductor device according to claim 21, wherein the chip contact areas of the semiconductor chip are electrically connected to the internal contact areas of the circuit carrier via Al bonding wires and/or Cu bonding wires and/or a Cu clip.

23. The semiconductor device according to claim 22, wherein the internal contact areas of the circuit carrier and the surface of the front side metallization consist essentially of the same material.

24. The semiconductor device of claim 1, wherein the intermediate layer covers upper and side edges of the adhesion layer.

25. A semiconductor device, comprising:
   a semiconductor chip having a first side and a second side, the first side having integrated circuit elements and an electrically conductive metallization structure with chip contact areas, the metallization structure having the following layers:
      an electrically conductive patterned adhesion layer, the adhesion layer being disposed on a surface of the first side of the semiconductor chip and providing an electrical contact with silicon,
      an electrically conductive patterned intermediate layer covering upper and side edges of the adhesion layer, and
      a passivation layer covering the intermediate layer,
      wherein the intermediate layer comprises nickel and is free of noble metals, and the intermediate layer is at least ten times thicker than the adhesion layer.

* * * * *